(12) United States Patent
Douskey et al.

(10) Patent No.: US 9,003,244 B2
(45) Date of Patent: *Apr. 7, 2015

(54) DYNAMIC BUILT-IN SELF-TEST SYSTEM

(71) Applicant: International Business Machines Corporation, Armonk, NY (US)

(72) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/955,619

(22) Filed: Jul. 31, 2013

(65) Prior Publication Data

US 2015/0039957 A1 Feb. 5, 2015

(51) Int. Cl.
G06F 11/00 (2006.01)
G01R 31/28 (2006.01)
G06F 11/27 (2006.01)

(52) U.S. Cl.
CPC .................................. *G06F 11/27* (2013.01)

(58) Field of Classification Search
CPC ............... H03K 19/17704; H03K 19/17764; G06F 11/27; G01R 31/3177; G01R 31/31715; G01R 31/318558; G01R 31/318566; G01R 31/31912; G01R 31/31924; G01R 11/277
USPC ............. 714/30, 732, 48, 733, 736, 724, 734, 714/E11.175, 728, 742, E11.155, E11.169, 714/25, 39, 46, 703, 37, 38, 45, 47
See application file for complete search history.

(56) References Cited

U.S. PATENT DOCUMENTS

| | | | |
|---|---|---|---|
| 6,023,960 | A | 2/2000 | Abrams et al. |
| 6,032,268 | A | 2/2000 | Swoboda et al. |
| 7,103,495 | B2 | 9/2006 | Kiryu |
| 7,266,745 | B2 | 9/2007 | Kiryu |
| 7,272,767 | B2 | 9/2007 | Colunga et al. |
| 7,472,320 | B2 | 12/2008 | Berndlmaier et al. |
| 7,765,445 | B2 | 7/2010 | Eckelman et al. |
| 7,797,596 | B2 | 9/2010 | Dixit et al. |
| 7,991,955 | B2 | 8/2011 | Bienek et al. |
| 8,122,312 | B2 | 2/2012 | Floyd et al. |
| 8,310,265 | B2 | 11/2012 | Zjajo et al. |

(Continued)

OTHER PUBLICATIONS

Sato et al., "Dart: Dependable VLSI Test Architecture and Its Implementation", 2012 IEEE International Test Conference, Paper 15.2, pp. 1-10, © 2012 IEEE. DOI: 10.1109/TEST.2012.6401581.

(Continued)

*Primary Examiner* — Phung M Chung
(74) *Attorney, Agent, or Firm* — Jonathan V. Sry; Robert R. Williams

(57) ABSTRACT

A method of performing a dynamic built-in self-test (BIST). The method includes performing a first test of a circuit on a semiconductor chip. The first test includes a first switch factor. The circuit during the first test is monitored with one or more sensors. A first sensor value of one or more sensors monitoring the circuit is determined. It is also determined whether the first sensor value is within a range of a programmable constant. A second switch factor is determined in response to determining that the first sensor value outside the range of the programmable constant.

8 Claims, 9 Drawing Sheets

(56) References Cited

U.S. PATENT DOCUMENTS

| | | |
|---|---|---|
| 8,407,542 B2 | 3/2013 | Douskey et al. |
| 8,549,363 B2 | 10/2013 | Cher et al. |
| 2009/0006025 A1* | 1/2009 | Fujibe .......................... 702/125 |
| 2011/0047427 A1* | 2/2011 | Bailey et al. ................... 714/732 |
| 2013/0069678 A1 | 3/2013 | Grosch et al. |

OTHER PUBLICATIONS

Stolt et al., "Design and Implementation of the POWER6 Microprocessor", IEEE Journal of Solid-State Circuits, vol. 43, No. 1, pp. 21-28, Jan. 2008, (Received Apr. 17, 2007, Revised Sep. 27, 2007), © 2008 IEEE. DOI: 10.1109/JSSC.2007.9109863.

* cited by examiner

DYNAMIC BUILT-IN SELF-TEST SYSTEM

TECHNICAL FIELD

Embodiments described herein generally relate to testing electronic components, and more specifically, to a dynamic built-in self-test (BIST) system.

BACKGROUND

Digital Integrated Circuits (ICs) can be prone to defects introduced during a manufacturing process. These defects may affect the logic output of the digital IC, which in turn adversely influences semiconductor chip quality and costs. Industry has developed a number of testing techniques to test for the defects. To test for defects, a built-in self-test (BIST) may be built into an IC, allowing the IC to test its own operations. BISTs may be implemented using hardware, software, or a combination of the two.

SUMMARY

Embodiments of the disclosure provide a method of performing a dynamic built-in self-test (BIST). The method includes performing a first test of a circuit on a semiconductor chip. The first test includes a first switch factor. The circuit during the first test is monitored with one or more sensors. A first sensor value of one or more sensors monitoring the circuit is determined. It is also determined whether the first sensor value is within a range of a programmable constant. A second switch factor is determined in response to determining that the first sensor value outside the range of the programmable constant.

In another embodiment, a method of determining a programmable constant for a sensor in a dynamic built-in self-test (BIST) system is described. The method includes performing a first test having a first switch factor for a circuit on a semiconductor chip. A first sensor value is determined from one or more sensors. The first sensor value is stored as the programmable constant.

In yet another embodiment, a semiconductor chip including a dynamic built-in self-test (BIST) system is described. The BIST system includes a circuit under test (CUT). The CUT generates a first switch factor when under a test. One or more sensors are configured to monitor one or more circuit conditions. Interface logic is in communication with the one or more sensors. The interface logic is configured to determine a sensor value and to determine whether the sensor value is within a range of a programmable constant. A test controller in communication with the interface logic and the CUT. The test controller is adapted to adjust the first switch factor of the circuit to a second switch factor when the interface logic signals that the sensor value is outside the range of the programmable constant.

BRIEF DESCRIPTION OF THE DRAWINGS

Embodiments are illustrated by way of example, and not by way of limitation, in the figures of the accompanying drawings in which like reference numerals refer to similar elements or steps.

DETAILED DESCRIPTION

Figure 1:
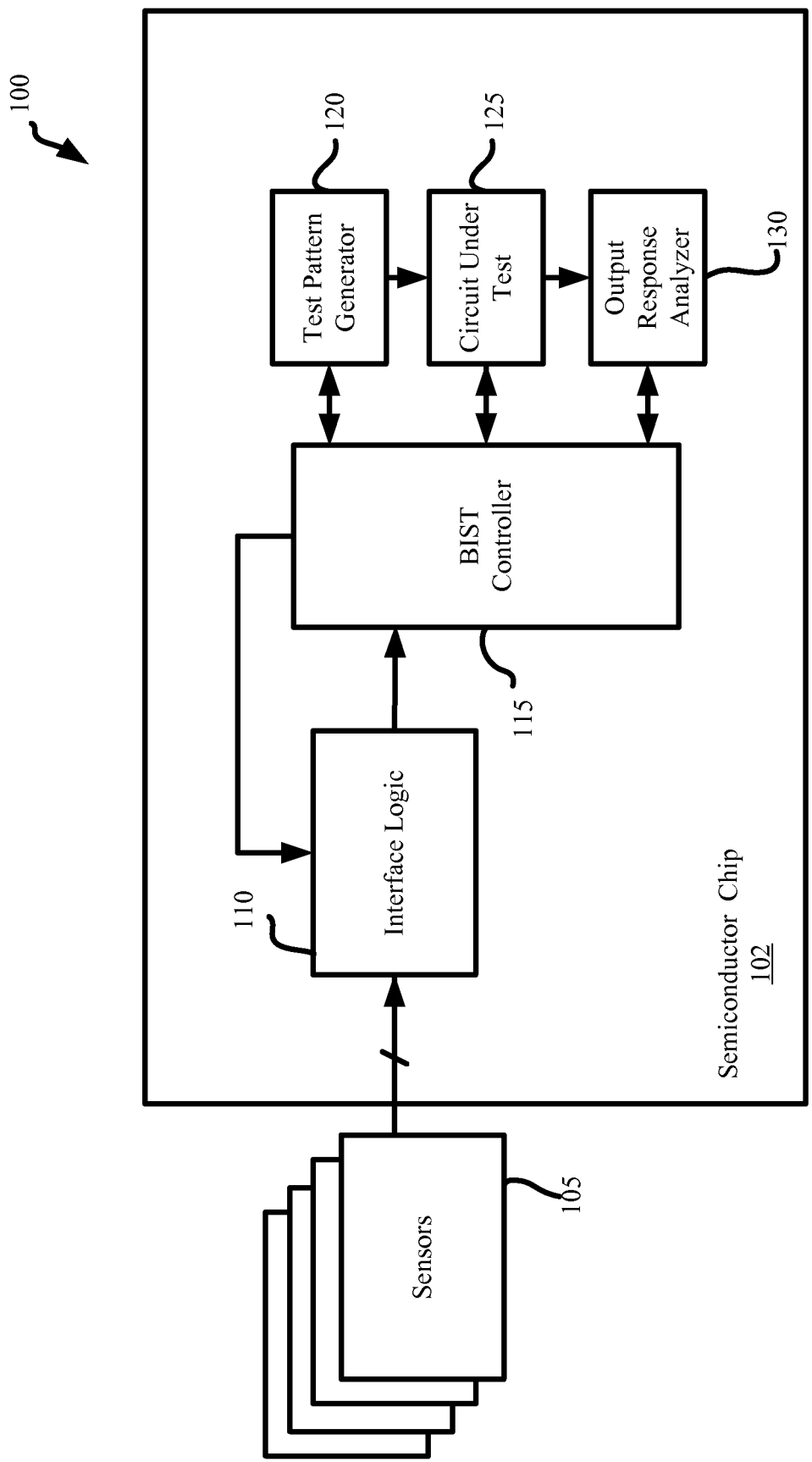
FIG. 1 illustrates a block diagram of an exemplary high-level dynamic built-in self-test (BIST) system, according to an embodiment.

Embodiments herein provide for a dynamic built-in self-test (BIST) system and a method for using thereof. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of the invention as claimed.

Built-in self-tests (BIST) are ubiquitous in many devices across many industries today. BIST may be a mechanism that allows a machine to test itself. Generally, in the field of integrated circuits BIST works by producing pseudo-random signals into circuitry and comparing the output of the circuitry to predicted results. Some examples of specialized versions of BIST are, but not limited to, programmable BIST (pBIST), logic BIST (LBIST), memory BIST (mBIST), array BIST (ABIST), and high speed serial link BIST (HSSBIST). For exemplary purposes, embodiments herein may be referred to with respect to LBIST methodologies with integrated circuits. However, other BIST methodologies may incorporate the embodiments described herein and therefore references to LBIST should not be limiting.

Integrated circuits continue to get smaller, more complex, and are typically manufactured together on a single semiconductor chip. Manufacturing semiconductor chips with complex, multiple integrated circuits may result in more defective chips, limiting the number of good chips available when manufactured. To increase yield of chips that may be used in devices, part performance concepts and technologies have been implemented to recover the use of the part of the semiconductor chip that is still good even though not all of the circuits of the chip function properly. This results in higher yield of manufactured chip usage.

Several part performance techniques that may be used are techniques such as, but not limited to, binning, selective redundancy, and partial good. Binning may be where optimal performance of a specific chip is determined. Selective redundancy may involve choosing a redundant component based on performance needs. Partial good may include isolating faulty circuits of a chip and allowing only the functioning circuits or the chips with a desired performance to be used. These strategies require testing methods, such as LBIST, for characterizing the chip or a chip subset.

Sensor data may also be used in part performance strategies. Some sensors that may be incorporated in the tests of the circuits after manufacturing may include, but is not limited to, temperature sensors and voltage sensors. A performance screen ring oscillators (PSRO) may be an example of both a temperature sensor and a voltage sensor. However, some of these sensors may not take measurements when the chip is in an active state. Also, measurements of the conditions taken after the manufacturing line may not be the same as the conditions of an end (customer) location (also referred to herein as in-system). Therefore, when running BISTs based off of sensor data to control the BISTs, incorrect sensor data may result due to the test not being stringent enough. This may result in defective chips being sent to customers. Otherwise, if sensor data is incorrect making the chip test too stringent, then this may result in false fails, which may affect yield of the semiconductor chip for customer use.

A BIST, such as LBIST, may incorporate sensor data when performing the BIST of the circuits of the semiconductor chip. Because of the additional circuitry used when performing LBIST, temperatures may be artificially high when testing a chip, or the LBIST itself may over-test the chip due to high latch switching rates (switch factor). In other situations, the LBIST may under-test the chip, which may result in a lower temperature than expected. For instance, performing a binning strategy, to determine an optimal circuit configuration of the available circuits on the chip, may require more stringent tests to determine which functioning circuits may not perform as well as other redundant ones. Higher temperature readings from a circuit may indicate that it is not performing as efficiently. Another example of a sensor that may be used to adjust LBIST is a voltage sensor to detect voltage droop when performing LBIST. When pseudorandom patterns from the scanning latches of the test circuitry are loaded, on average 50% of the latches may change state due to the random pattern. If all the latches are scanned on each clock cycle, the resulting large change in current may lead to voltage droop. For LBIST to test successfully, voltage droop may need to be within a certain parameter. For instance voltage droop may need to be less than 5%.

Embodiments herein may provide for a dynamic BIST system and methods thereof. In an embodiment, a switch factor of a BIST of a circuit may be modified by changing the test pattern inputted into the circuit. Sensor data from sensors affected by the switch factor may be compared to a programmable constant, which may be an ideal sensor data value, to determine whether the switch factor needs to increase or decrease. In another embodiment, sensor data used during a BIST test may be used to adjust a programmable constant for ideal BIST conditions to account for an in-system condition. In another embodiment, sensor data from in-system BIST runs may be used to adjust tester settings to better match in-system conditions. For instance, if recursive tuning runs show the normal in-system test is experiencing a 5% voltage droop, then during BIST the settings necessary to achieve these same conditions on the tester can be determined with a single tuning run and applied to a BIST.

FIG. 1 illustrates a high level block diagram of a dynamic BIST system 100, according to an embodiment. The BIST system 100 may include one or more sensors 105, and a semiconductor chip 102. The semiconductor chip 102 may include interface logic 110, a BIST controller 115, a test pattern generator 120, a circuit under test (CUT) 125, and an output response analyzer (ORA) 130. The sensors 105 may include, but are not limited to, one or more temperature sensors, voltage sensors, and PSROs or combinations thereof. The sensors 105 may be in operable communication with one or more components of the dynamic BIST system 100. For instance, a temperature sensor may be in thermal communication with the rest of the BIST system 100 or the voltage sensors may be in electrical communication. In another embodiment, the sensors 105 may be part of the semiconductor chip 102.

The sensors 105 may signal the interface logic 110 with sensor data from the sensors 105. The interface logic 110, described further in FIG. 2, may compare sensor data to a programmable constant 205 (FIG. 2) to determine the difference between the sensor data and the programmable constant 205 for a particular sensor type. For example, the programmable constant 205 may include a temperature at which the BIST performs correctly. If the difference between the sensor data and the programmable constant 205 does not meet a range, the interface logic 110 may signal the BIST controller 115 the extent outside a range for the particular condition. If the interface logic 110 detects the condition is within a range, then the interface logic 110 may signal the BIST controller 115 of this.

Figure 3:
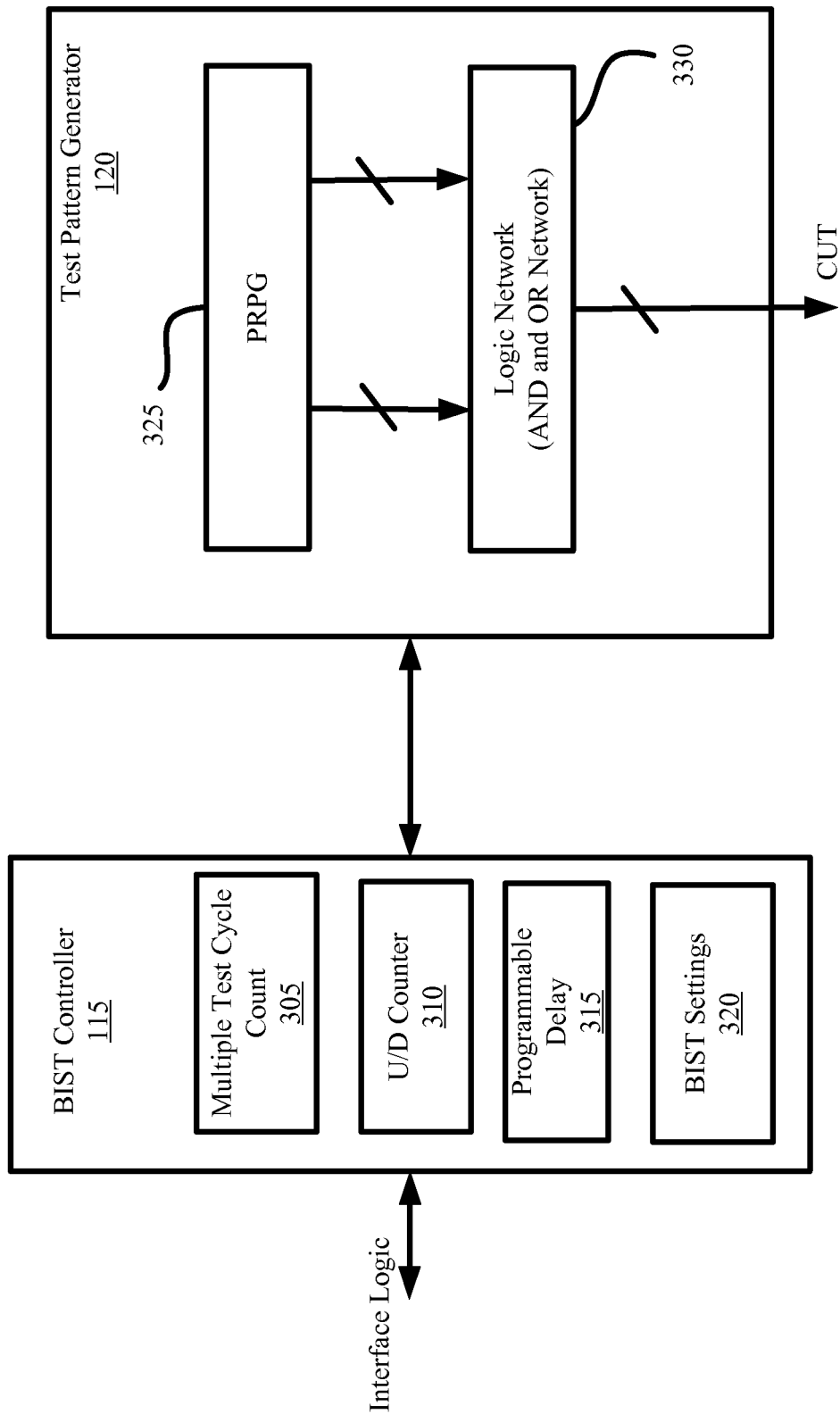
FIG. 3 illustrates a block diagram of an exemplary BIST controller and test pattern generator of FIG. 1, according to an embodiment.
Figure 4:
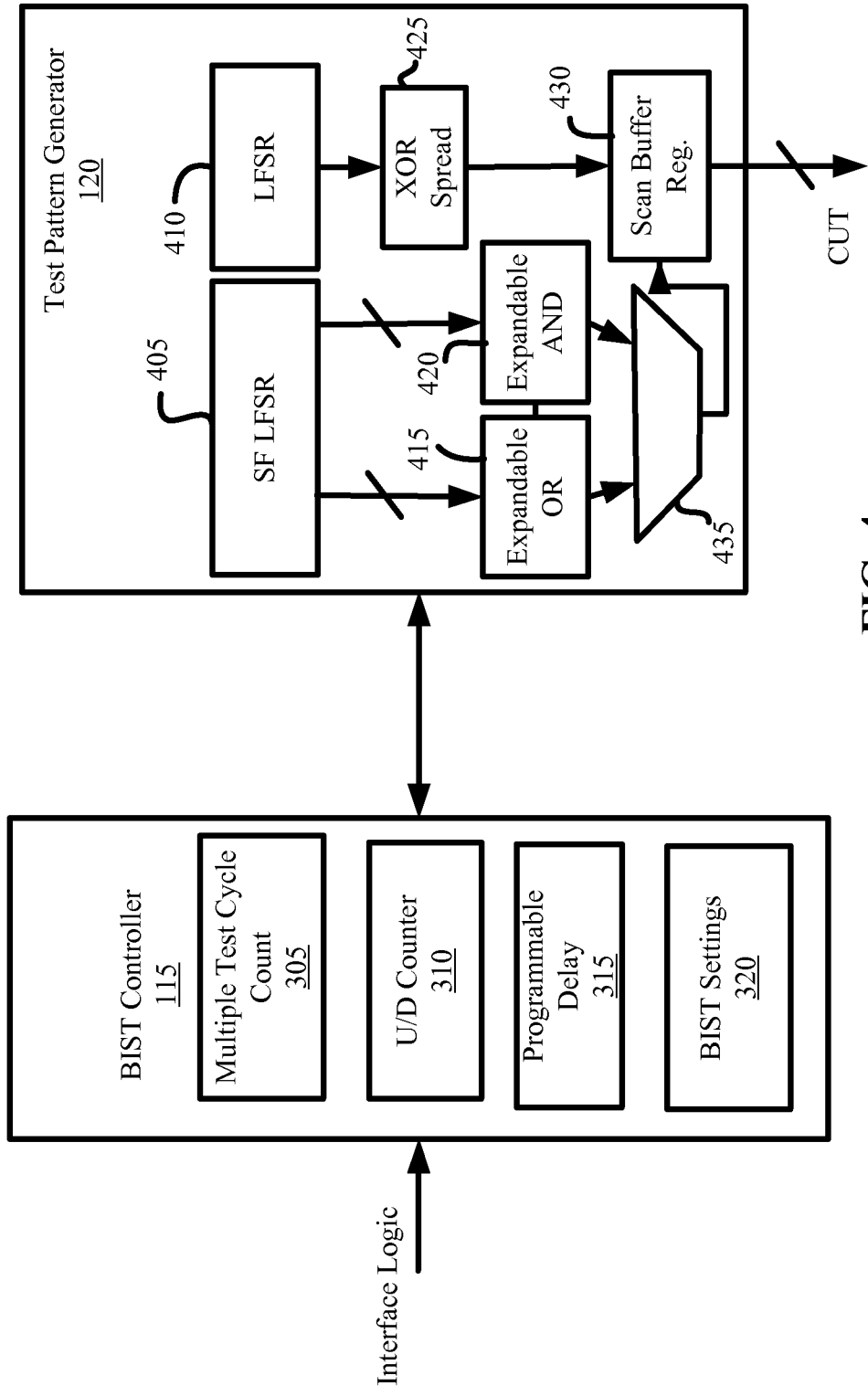
FIG. 4 illustrates a block diagram of another example of the test pattern generator of FIG. 1, according to an embodiment.
Figure 5:
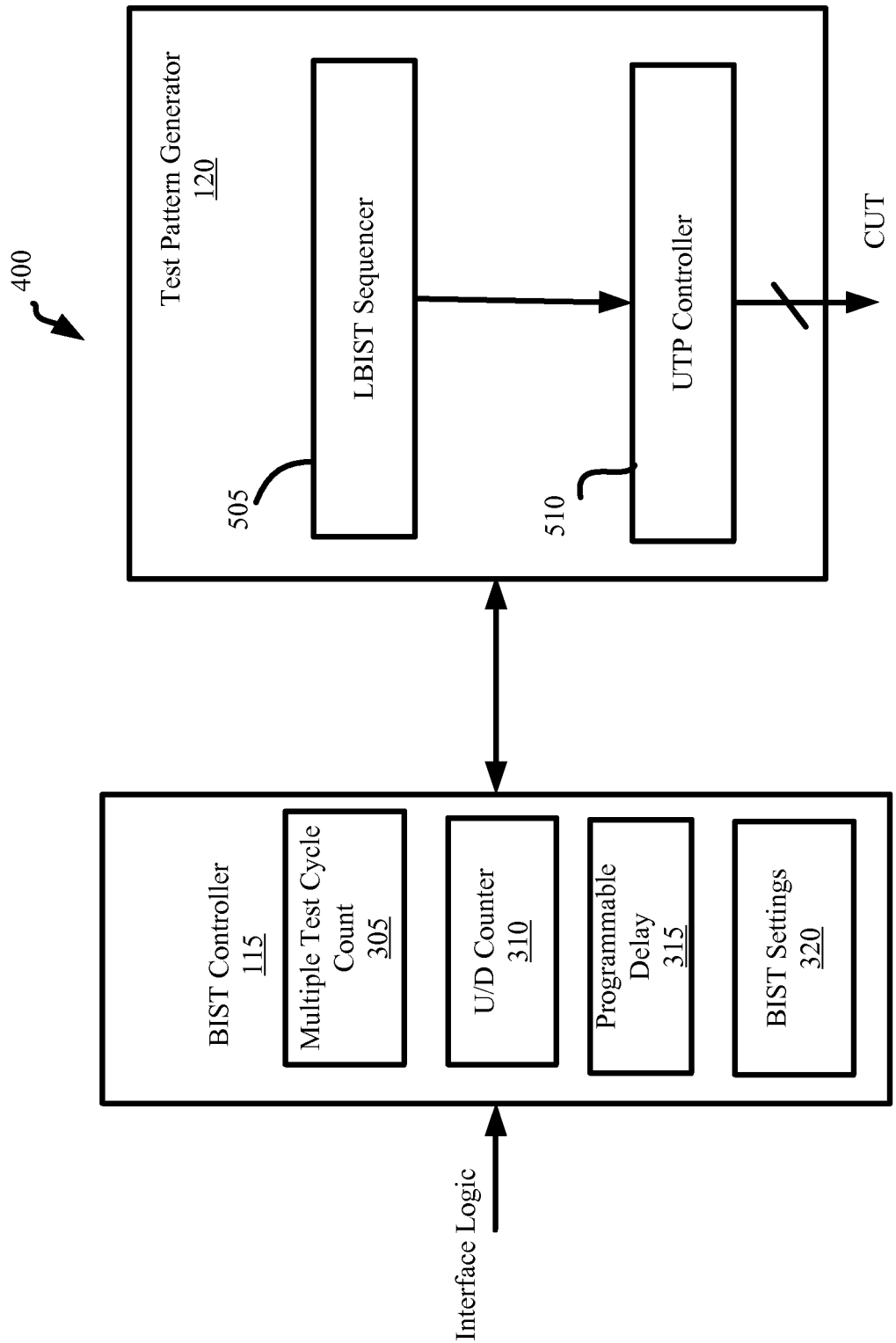
FIG. 5 illustrates a block diagram of another example of the test pattern generator of FIG. 1, according to an embodiment.

The BIST controller 115, further discussed in FIG. 3-FIG. 5, may provide feedback to the interface logic 110 and the sensors 105 as it performs the BIST of CUT 125. The BIST controller 115 may also be in communication with the test pattern generator 120, the CUT 125, and the ORA 130. The test pattern generator 120 may be one of many mechanisms for generating a test pattern to run through the CUT 125. As the test patterns pass through the CUT 125, the ORA 130 may gather the outputs of the CUT 125 in a signature register, such as a multiple-input signature register (MISR), as a signature. The ORA 130 may then compare the signature to an expected signature. A failure may be returned if the signature and the expected signature do not match.

Figure 2:
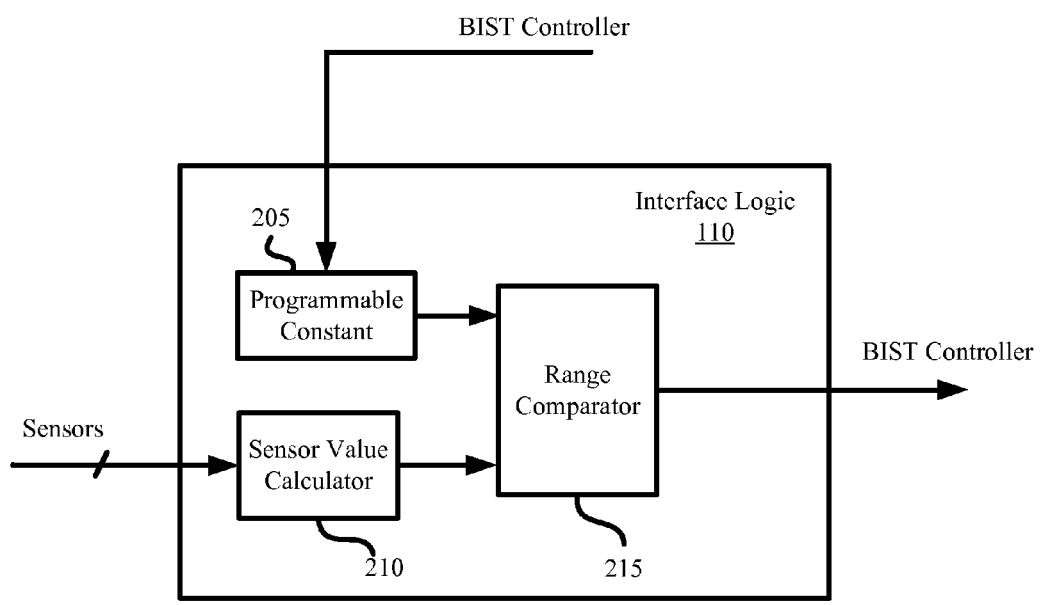
FIG. 2 illustrates a block diagram of exemplary interface logic of FIG. 1, according to an embodiment.

FIG. 2 illustrates exemplary interface logic 110 of FIG. 1, according to an embodiment. The interface logic 110 may include a programmable constant 205, a sensor value calculator 210, and a range comparator 215. The programmable constant 205 may correspond with one or more conditions for which the BIST performs correctly. For instance, there may be a programmable constant 205 for temperature or for voltage droop to get a reliable BIST result. For an example of voltage droop, the BIST may not be reliable if the voltage droop is greater than 5%. The interface logic 110 may also receive the sensor data from the one or more sensors 105 at a programmable time interval. The programmable time interval may only be the time of several clock cycles for voltage measuring or it may be several seconds or even minutes when waiting for temperature changes to occur.

In an embodiment, the interface logic 110 may include a sensor value calculator 210 to determine a sensor value for one or more sensors 105 of a particular condition. For instance, if there were multiple temperature sensors with multiple sensor data, then the sensor value calculator 210 may use the sensor data from the multiple temperature sensors to determine an average value. The average value of the sensor data may be the sensor value. In other embodiments, the sensor value calculator 210 may determine the sensor value to be the minimum or maximum sensor data.

The sensor value may be calculated so that the programmable constant 205 may be compared to it to determine whether the sensor value is within a range of the programmable constant 205. When the sensor value is within the range this may also be referred to as the set-point. The comparison between the programmable constant 205 and the sensor value may be done by the range comparator 215. The range comparator 215 may signal the BIST controller 115 with an active signal to indicate the adjustment to the BIST is required. The range comparator 215 may also signal the BIST controller 115 with an up/down signal to indicate how the BIST controller 115 needs to adjust the BIST to lower or raise the switch factor.

FIG. 3 illustrates exemplary BIST controller 115 and test pattern generator 120, according to an embodiment. In an embodiment, the BIST controller 115 may include a multiple test cycle count module 305, an up/down (U/D) counter 310, a programmable delay register 315, and BIST settings 320. The BIST controller 115 may also include its own control logic besides the illustrated modules that may control the BIST and modules. In an embodiment, the test pattern generator 120 may be a weighting BIST mechanism that may include a pseudorandom pattern generator (PRPG) 325 and logic network 330.

When BIST is active, the semiconductor chip 102 may be in scan mode and test pattern generator 120 may be inputting scan data into the CUT 125. The scan data may be scanned at a reliable speed and is typically and initially a roughly equal ratio of logical ones and logical zeros. To achieve a desired sensor value, the ratio of logical ones to logical zeros may be changed to reduce or increase the amount of switching in the CUT 125. This change of the switch factor may cause a parameter condition, to change so that a desired sensor value may be sensed by sensors 105 measuring conditions such as temperature and voltage droop.

In an embodiment, adjusting the switch factor to achieve a desired sensor value may be accomplished when the BIST controller 115 receives a signal from the interface logic 110 that the sensor value is outside the range of the programmable constant 205. The up/down counter 310 may determine, based on the signal from the interface logic 110, whether to lower or raise the switch factor of the BIST. The BIST settings 320 may be adjusted by the BIST controller 115 based on the determination of the U/D counter 310. The BIST settings 115 may be signaled to the test pattern generator 120 to adjust the ratio of logical ones to logical zeros. In FIG. 3, this may be done by adjusting the number of PRPG 325 and spreading network outputs that are passed through the logic network 330 such as an AND or OR network to create the scan data for the CUT 125.

The BIST may continue to run for multiple test cycles before the BIST controller 115 checks the interface logic 110 again. The multiple test cycle count 305 may count the number of test cycles and the programmable delay 315 may determine when the BIST controller 115 is going to receive a signal from the interface logic 110 again to determine whether the BIST needs more adjustment to meet the desired sensor value. The delay may also signal when the interface logic 110 may receive sensor data to do another comparison. The delay may be necessary to allow the sensors 105 time to detect change to the system 100 after the switch factor is changed. In an embodiment, the signal from the interface logic 110 may be used to adjust the BIST settings 320 when the BIST is not scanning and with one adjustment step of the BIST settings 320 at a time from the current step. The adjustments to the BIST settings 320 may end when a maximum number of test cycles has completed or a set-point has been reached. The set-point may be where the sensor value is within a range of the programmable constant 205. The set-point may be detected when the U/D counter 310 switches polarity after several readings.

In an embodiment, the ORA 130 may be adjusted to look for changes in the scan data from the output of the CUT 125. For example, if the test pattern generator 120 outputs a roughly equal number of logical ones and logical zeros, a signature from the CUT 125 may be expected at the ORA 130, which may also contain roughly an equal amount of logical ones and logical zeros. However, if the ratio of logical ones and logical zeros is adjusted at the test pattern generator 120 to adjust the switch factor, then a different signature may be received at the ORA 130 which would return a false failure when compared to the expected signature for the equal ratio of logical ones and logical zeros. Therefore, the ORA 130 needs to recognize multiple signatures.

This may be done by the BIST controller 130 indicating to the ORA 130 the adjustment to the BIST settings 320 affecting the test pattern generator 120 and the new expected signature for the adjustment. In another embodiment, the ORA 130 may have several expected signatures it can compare to the signature of the CUT 125. If the signature of the CUT 125 matches one of the expected signatures, then the ORA 130 may not return any failures on the CUT 125. This may be possible because the odds of a failure producing one of the several expected signatures may be very low.

In another embodiment, the dynamic BIST system 100 may be used to adjust the programmable constant 205. In some situations, the in-system use of the chip 102 may have different conditions influencing it than when the semiconductor chip 102 was tested after manufacturing. This may result in false failures when performing a BIST during in-system testing due to incorrect sensor constants. Therefore, it may be necessary to adjust the programmable constant 205 to reflect the in-system conditions. The programmable constant 205 may be changed and the BIST controller 115 may monitor the ORA 130 to determine whether any failures occur. The programmable constant 205 may be changed to the sensor value after the results of the in-system functional operation are measured. If there are failures during the in-system BIST, then the CUT 125 may be retested with a different BIST test pattern. This may be repeated until the ORA 130 does not detect a failure. The programmable constant 205 may then be set at the sensor value where a failure does not occur. The programmable constants 205 determined during in-system use may also be used during testing after manufacturing to better test for a particular customer.

FIG. 4 illustrates another embodiment of a test pattern generator 120 where the switch factor may be adjusted. The test pattern generator 120 may include a switch factor linear feedback shift register (SF LFSR) 405 in communication with expandable logic such as an expandable OR 415 and an expandable AND 420. These expandable logics may be in communication with a demultiplexor 435 which in turn may signal a scan buffer register 430. The test pattern generator 120 may also include a linear feedback shift register (LFSR) 410. The LFSR may signal an XOR spread 420 which may signal the scan buffer register 430. The scan buffer register 430 may provide the signals to the CUT 125.

Adjusting the switch factor through the SF LFSR mechanism may be done by stretching the test pattern scan data of the test pattern generator 120 through the scan buffer registers at the top of each scan channel of the CUT 125. The SF LFSR mechanism may be discussed further in U.S. Pat. No. 8,407,542 by Douskey, et al., entitled "Implementing Switching Factor Reduction in LBIST", issued Mar. 26, 2013 and incorporated herein by reference.

In FIG. 5, another embodiment of the test pattern generator 120 is illustrated. The test pattern generator 120 may include a BIST sequencer 505 and a UTP controller 510. Timing settings may be signaled from the BIST controller 115 to the UTP controller 510. To reduce the switch factor, the timing of the scan may be adjusted to reduce the number of scan cycles in any given time frame. For instance, reducing the number of scan cycles may reduce the amount of latch switching, thus reducing the switch factor.

Figure 6:
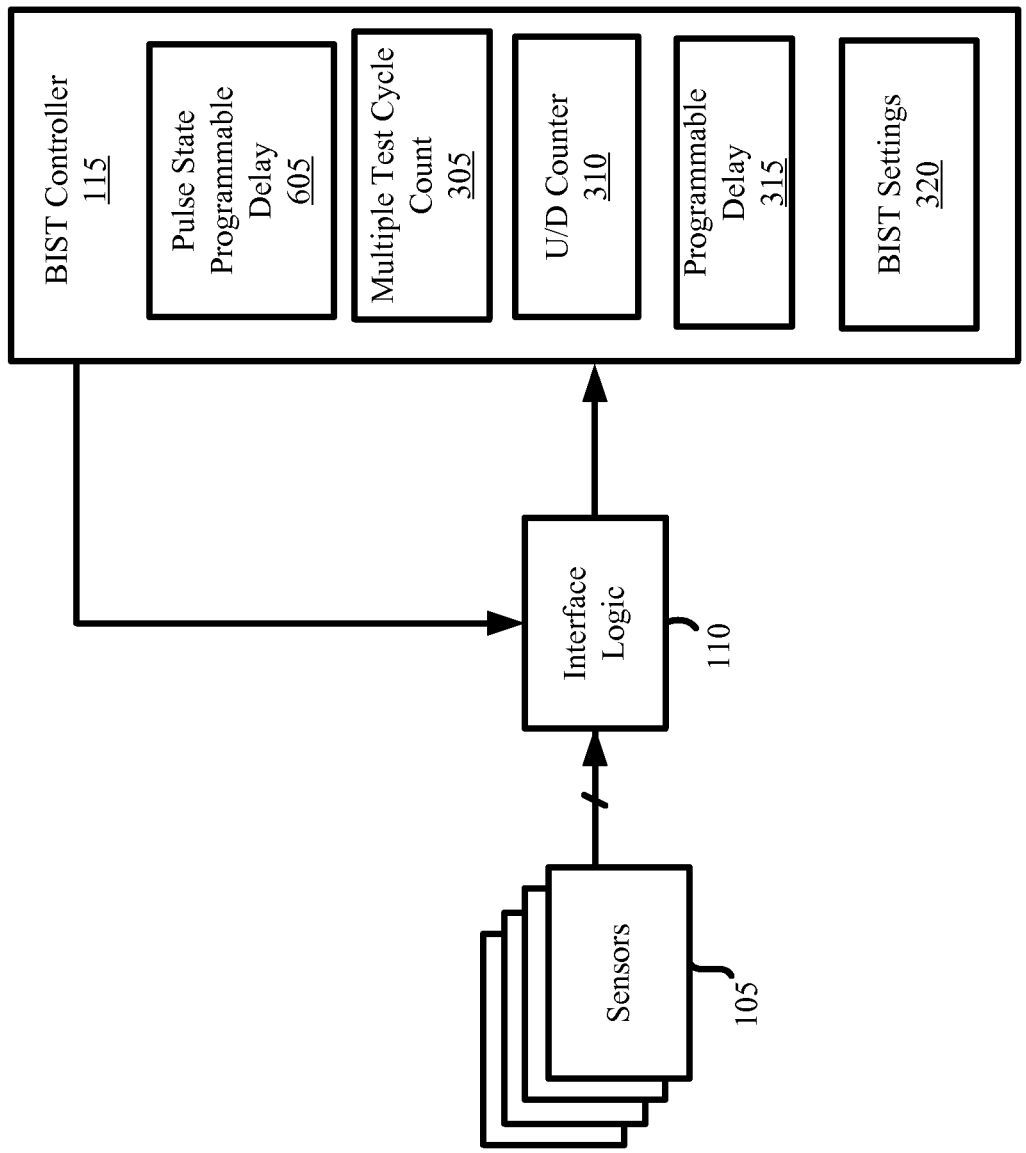
FIG. 6 illustrates a block diagram of an example of the BIST controller of FIG. 1, according to an embodiment.

FIG. 6 illustrates a dynamic BIST system 100 that may be in a pulse state, according to an embodiment. BIST pulse state represents a short period of high switch factor over a very short period of time that may be used to characterize local voltage droop. Here the switch factor may be adjusted by changing the scan data output of the test pattern generator 120. A test pattern generator 120 with the weighting and the SF LFSR gating methods described in FIG. 3 and FIG. 4, respectively, may be used here since they affect the switch factor of the pulse test.

For this pulse state, the sensor 105 may sense voltage of the pulse state which may be sent to the interface logic 105. To obtain the voltage data during the voltage droop for the calculated sensor value, a pulse state programmable delay 605 may control when the interface logic 105 reads the voltage at its lowest point. Once read at this point the interface logic 105 may calculate the sensor value with the sensor value calculator 210 and compare it to the programmable constant 205.

Figure 7:
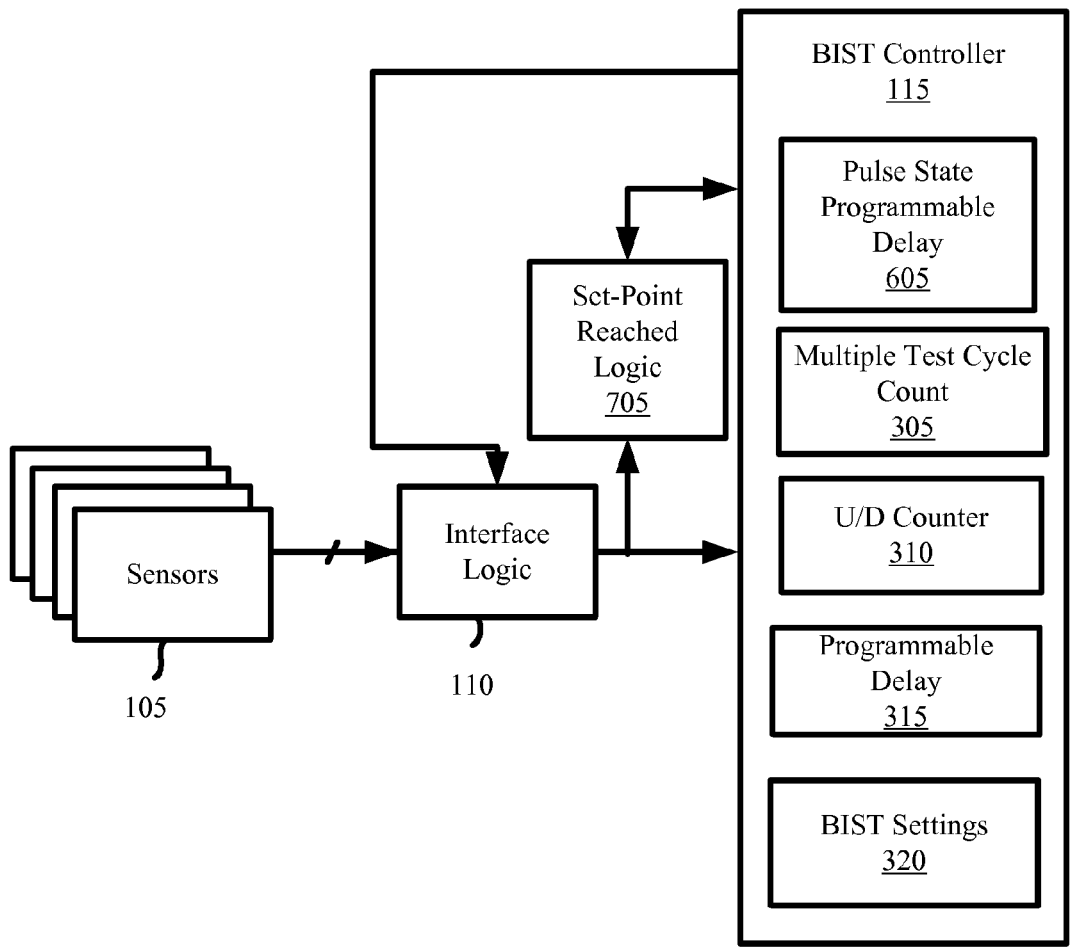
FIG. 7 illustrates a block diagram of an example of the dynamic BIST system with a set-point logic module, according to an embodiment.

FIG. 7 illustrates a dynamic BIST system 100 with set-point reached logic 705, according to an embodiment. The set-point reached logic 705 may end the BIST as soon as the sensor value reaches the set-point. This may be done by detecting when the U/D counter 310 switches polarity after several debounced readings.

Figure 8:
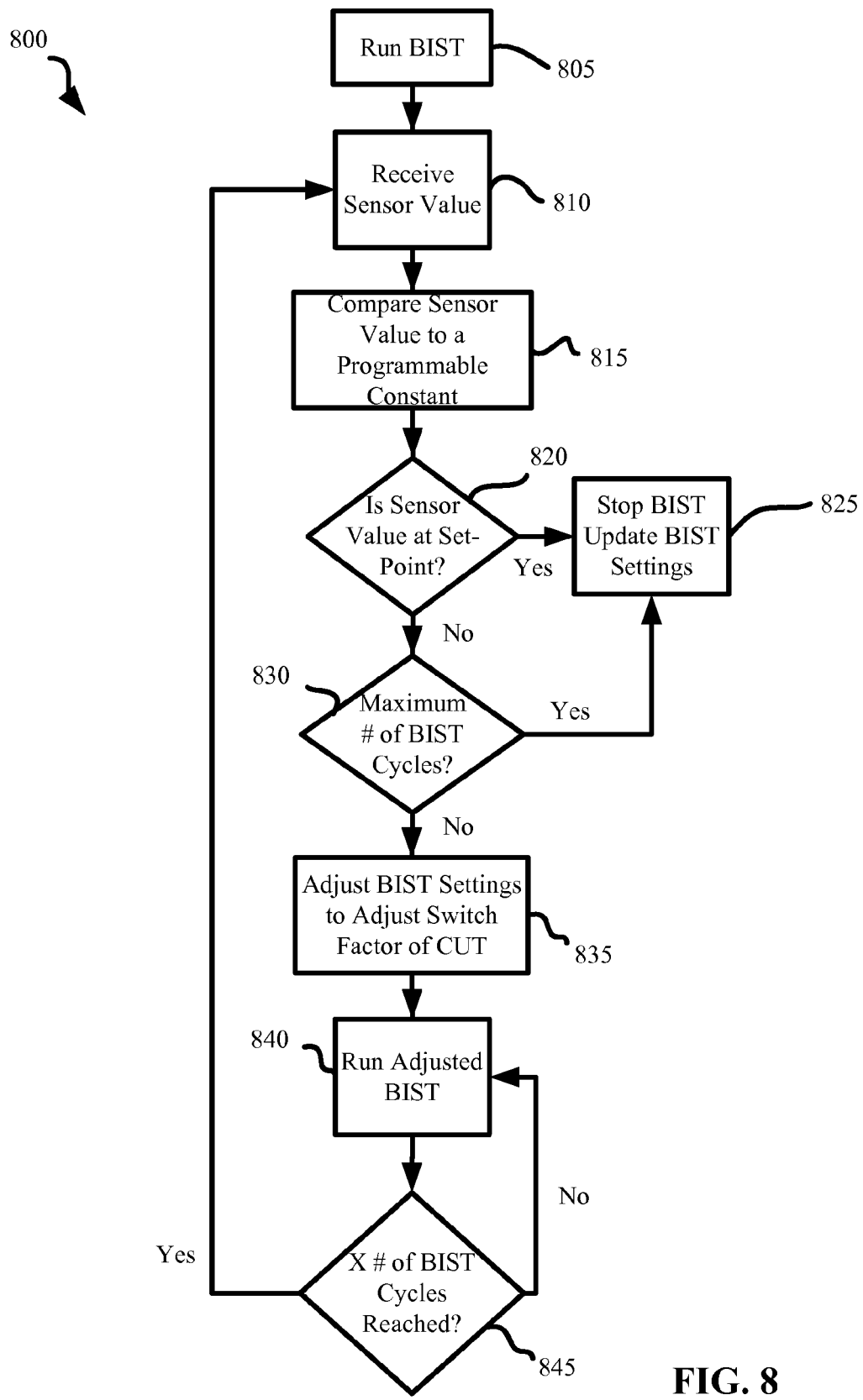
FIG. 8 illustrates a flowchart of a method of performing the dynamic BIST, according to an embodiment.

FIG. 8 illustrates a flowchart of a method 800 of performing a dynamic BIST, according to an embodiment. In operation 805, the BIST may be run with the current or initial BIST settings 320. Sensors may be monitoring the BIST and gathering data. In operation 810, the interface logic 110 may receive sensor data and determine a sensor value. The sensor value may be the average of all sensors 105 or a minimum or maximum of all sensors 105. In an embodiment, the sensor value could be a reading of a sensor. In operation 815, the sensor value may be compared to the programmable constant 205. In operation 820, the interface logic 110 may determine whether the sensor value is within a range (set-point) of the programmable constant 205. If the sensor value is at set-point, then in operation 825 the BIST may be stopped and the BIST settings 320 may be updated to the settings that created the sensor value.

If the set-point has not been reached, then, in operation 830, it may be determined whether the maximum number of BIST cycles for a given BIST has been reached. If the maximum number of BIST cycles has been reached, then, in operation 825, the BIST may stop and the BIST settings 320 may be updated to the current settings. If the maximum number of BIST cycles has not occurred, then, in operation 835, the BIST settings 320 may be adjusted to adjust the switch factor of the CUT 125. In operation 840, the BIST may run again with the adjusted BIST settings 320 to change the switch factor. In operation 845, the BIST with the new BIST settings 320 may keep repeating the BIST until a condition is met such as time or number of cycles has completed. Once the condition in operation 845 is met, then the method 800 may return to operation 810 where the interface logic 110 receives sensor data and determines a sensor value.

Figure 9:
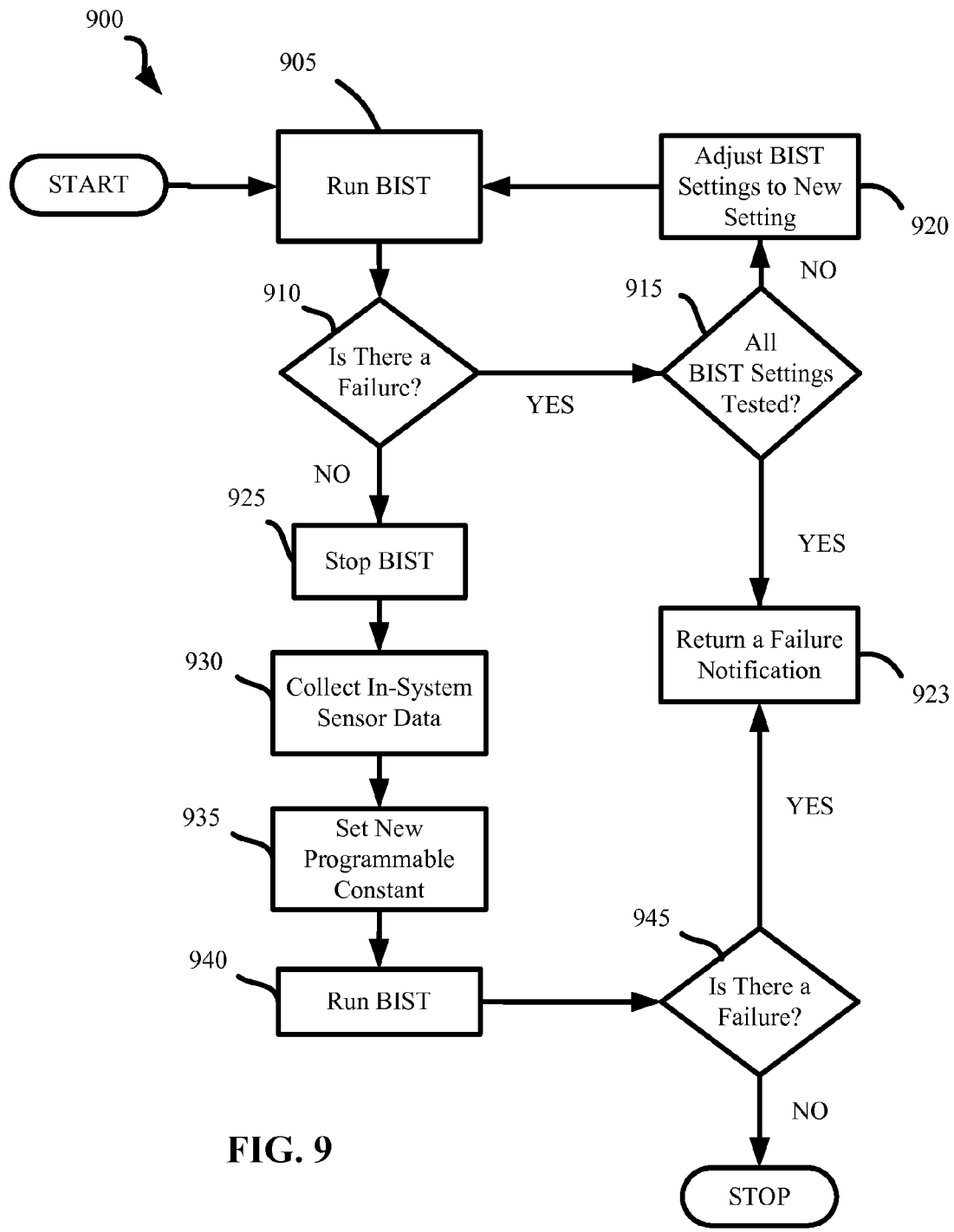
FIG. 9 illustrates a flowchart of a method for updating the programmable constant for in-system conditions, according to an embodiment.

FIG. 9 illustrates a flowchart of a method 900 for updating the programmable constant 205 for in-system conditions, according to an embodiment. In operation 905, the BIST may be run with the factory BIST settings and with a factory programmable constant 205. In operation 910, the ORA 130 and BIST controller 115 may detect whether there is a failure during the BIST. If there is a failure, then, in operation 915, it may be determined whether all the possible BIST settings 320 have been tested. If all of the BIST settings 320 have not been tested, then, in operation 920, the BIST settings 320 may be adjusted to untested BIST settings 320. If the all of the BIST settings have been tested, then, in operation 923 the BIST system 100 may return a failure. If there is not a failure, then, in operation 925, the BIST may be ended. In operation 930, the sensor data may be collected and a sensor value may be calculated. In operation 935, the programmable constant may be set to the sensor value. In operation 940 the BIST may be ran again with the current BIST settings. In operation 945, it may be determined whether there is a failure. If there is a failure, then, in operation 923, a failure may be returned. If there is no failure, then the method may end.

While embodiments have been described with reference to the details of the embodiments shown in the drawings, these details are not intended to limit the scope of the invention as claimed in the appended claims.

What is claimed is:

1. A semiconductor chip comprising:
a dynamic built-in self-test (BIST) system comprising:
a circuit under test (CUT), the CUT generates a first switch factor when under a test;
one or more sensors configured to monitor one or more circuit conditions;
an interface logic in communication with the one or more sensors, the interface logic configured to determine a sensor value and to determine whether the sensor value is within a range of a programmable constant; and
a test controller in communication with the interface logic and the CUT, the test controller adapted to adjust the first switch factor of the circuit to a second switch factor when the interface logic signals that the sensor value is outside the range of the programmable constant.

2. The semiconductor chip of claim 1, further comprising:
an output response analyzer (ORA) in communication with the CUT, the ORA adapted to receive an output signature from the CUT and determine whether the output signature is an expected signature.

3. The semiconductor chip of claim 1, further comprising:
a multiple test cycle count configured to signal the interface logic to read the one or more sensors after a programmable delay.

4. The semiconductor chip of claim 1, further comprising:
a set-point reach logic configured to end the test when the sensor value reaches a set-point that is within the range of the programmable constant.

5. The semiconductor chip of claim 4, wherein the set-point reach logic detects the set-point when an up/down counter switches between polarities.

6. The semiconductor chip of claim 1, wherein the test controller end the test after a maximum number of test cycles has been performed.

7. The semiconductor chip of claim 1, further comprising:
a test pattern generator configured to create test patterns of the test based on the test settings, wherein the test pattern generator is a weighting mechanism.

8. The semiconductor chip of claim 1, further comprising:
a test pattern generator configured to create test patterns of the test based on the test settings, wherein the test pattern generator is a switch factor linear feedback shift register.

* * * * *